United States Patent [19]

Turner

[11] Patent Number: 4,833,646

[45] Date of Patent: May 23, 1989

[54] PROGRAMMABLE LOGIC DEVICE WITH LIMITED SENSE CURRENTS AND NOISE REDUCTION

[75] Inventor: John E. Turner, Beaverton, Oreg.

[73] Assignee: Lattice Semiconductor Corp., Hillsboro, Oreg.

[21] Appl. No.: 707,670

[22] Filed: Mar. 4, 1985

[51] Int. Cl.$^4$ .................. G11C 11/40; G11C 7/00; G06F 7/38; H04Q 00/00

[52] U.S. Cl. .................. 365/185; 365/189.08; 365/208; 307/468; 340/825.83; 340/825.87; 340/825.41

[58] Field of Search .................. 365/184, 185, 189, 94, 365/103, 104, 206; 307/465, 468; 340/825.83, 825.84, 825.85, 825.86, 825.87, 825.88, 825.89, 825.90, 825.91, 825.93; 357/23.5; 364/716

[56] References Cited

U.S. PATENT DOCUMENTS

| | | | |
|---|---|---|---|
| 4,177,452 | 12/1979 | Balasubramanian et al. | 365/189 |
| 4,233,526 | 11/1980 | Kurogi et al. | 365/184 |
| 4,314,360 | 2/1982 | Higuchi et al. | 365/185 |
| 4,434,478 | 2/1984 | Cook et al. | 365/104 |
| 4,490,812 | 12/1984 | Guterman | 307/465 |
| 4,503,520 | 5/1985 | Kyomasu et al. | 365/177 |
| 4,617,479 | 10/1986 | Hartmann et al. | 307/465 |

FOREIGN PATENT DOCUMENTS 0199501 10/1986 European Pat. Off. .
0137933 10/1979 Japan .................. 365/185

OTHER PUBLICATIONS

Richman, "Characteristics and Operation of MOS Field Effect Devices", McGraw-Hill, Inc., 1967, pp. 114–118.

Horninger, "A High Speed ESFI SOS Programmable Logic Array with an MNOS Version", IEEE Journal of Solid State Circuits, vol. SC-10, No. 5, Oct. 1975, pp. 331–336.

IBM Technical Disclosure Bulletin, vol. 22, No. 22, No. 10, Mar. 1980, pp. 4621–4622; D. G. Grice et al.: "Electrically Programmable Logic Array".

IEEE Journal of Solid-State Circuits, vol. SC-16, No. 5, Oct. 1981, pp. 570–577, New York; R. A. Wood et al.: "An Electrically Alterable PLA for Fast Turnaround-Time VLSI Development Hardware".

Onde Electrique, vol. 63, No. 4, Apr. 1983, pp. 33–41, Paris, FR; Ph. Roux et al.: "Les Memoires non volatiles electriquement reprogramables. Bilan et perspectives."

Electronics, vol. 53, No. 5, Feb. 1980, pp. 113–117, New York; W. S. Johnson et al.: "16-K EE-PROM Relies on Tunneling for Byte-Erasable Program Storage".

Primary Examiner—Stuart N. Hecker
Assistant Examiner—Glenn A. Gossage
Attorney, Agent, or Firm—Roberts and Quiogue

[57] ABSTRACT

A programmable logic device is disclosed which is adapted to isolate the Miller capacitances of erased memory cells from the product terms and to limit the cell current drawn through the product term sense amplifiers. The invention substantially reduces the row switching noise coupled onto the product terms, allows high speed sense amplifier operation, and significantly reduces the power dissipated by the device. In accordance with the invention, the electrically erasable sense transistor for each memory cell is disposed between the cell select transistor and the product term sense amplifier, thereby isolating the Miller capacitance associated with the select transistor from the sense amplifier when the cell is in the erased (nonconductive) state. Separate product term ground lines are provided for each product term. A current limiter connects each product term ground line to ground, and is adapted to limit the current flow through each product term to a predetermined maximum level, typically about the maximum current level which may be passed through one conductive memory cell.

26 Claims, 5 Drawing Sheets

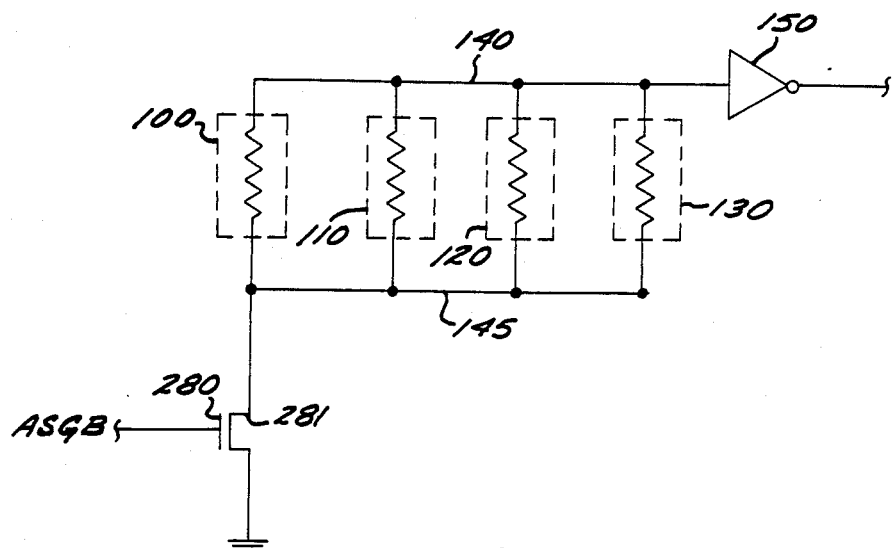
FIG. 7
FIG. 8
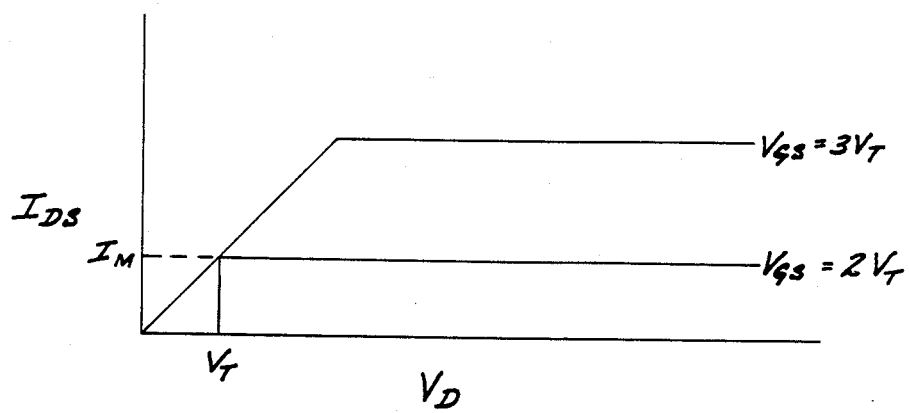

PROGRAMMABLE LOGIC DEVICE WITH LIMITED SENSE CURRENTS AND NOISE REDUCTION

BACKGROUND OF THE INVENTION

The present invention relates to improvements in programmable logic devices (PLDs), and more particularly to techniques for limiting the sense currents drawn during interrogation of the PLD array and reducing the noise coupling onto the array sense amplifiers caused by the switching of cell selection devices.

The architecture of the typical PLD allows the buffered input signals to pass directly into the programmable AND array or matrix of the device. For example, a PLD may have sixteen input signals making up thirty-two possible input lines, since each input signal normally has true and compliment signals associated therewith going to the AND array.

Each AND array comprises a plurality of memory cells or switches, arranged in an array (the AND array) of rows and columns (or product terms). The input signals drive respective rows of the array, and the respective product terms are connected to sense amplifiers, an OR gate array and other output logic circuitry as is known to those skilled in the art. The state of a particular array cell determines whether or not the respective row input signal is coupled onto the corresponding product term line for that memory cell.

The memory cells each typically comprise a select transistor which is turned on when the corresponding row input signal is active. If the cell memory unit (a fuse switch or other memory device such as a floating-gate field effect transistor) is conductive, the input signal will be coupled onto the product term.

The assignee of the invention has recently developed a PLD employing electrically-erasable, floating-gate, field effect transistors as the memory or sense element of the cells of the AND array. Such floating gate transistors have been employed in the past for electrically erasable, programmable memories (EEPROMs). In a typical EEPROM memory, the select transistor for a particular cell is formed by the intersection of a polysilicon input line and the product term active area. The polysilicon acts as the gate electrode of the select transistor, with the source and drain formed by N-type implanted dopant in the active area. During processing of the PLD, the N-type dopant laterally diffuses beneath the polysilicon gate. This lateral diffusion forms an overlap region associated with the gate. This capacitance is often referred to as Miller capacitance.

A conventional electrically erasable memory array is illustrated by the simplified diagram of FIG. 1. Traditionally, the select transistor M1 is placed between the sense transistor M2 (the floating gate device) and the sense amplifier located at the end of the column or product term. This configuration works well for memory applications where only one row switches at a time. This configuration also lays out in the minimum chip area because the column can be bi-directional, i.e., used for both reading and writing data from and to the memory array. The conventional EEPROM cell configuration is not advantageous for a PLD, because many rows may be switching simultaneously, leading to increased product term noise due to capacitive coupling of the overlap region, increasing input-to-output signal delays. With sixteen (or more) input lines switching from high to low (or vice versa) simultaneously, considerable switching noise can be capacitively coupled onto the product term. Product term noise can result in debiasing of the high speed sense amplifier, causing increased input-to-output signal delays.

Another characteristic of PLDs is the relatively high cell currents that may be drawn through a particular product term when several of the row lines are selected and the memory cells associated with those row lines are conductive.

In the PLD configuration recently developed by the assignee of the present invention, separate sense amplifiers are provided for each product term, and function as current sensing voltage sources. The advantage of this sense amplifier is its high speed. In order to provide the required high speed, the sense amplifiers are very sensitive, and are activated by relatively small input voltage swings. The amplifiers function in an analogous manner to a voltage source which can source a high current level to maintain the voltage level. The sense amplifier sources current to ground through the memory cells which are turned on. Thus, for an array with 32 rows of cells arranged in columns or product terms, when many cells are turned on the sense amplifier for a particular product term may be sourcing many times the current required for a single cell. For example, each programmed cell may be capable of sinking 50 $\mu$A each, and it is possible (although not probable) that one-half of the cells in a 2048 cell array could be on, sinking 50 $\mu$A each for a total of 51.2 mA of cell current. The high current flow leads to excessive power dissipation and chip failure rates, and is unnecessary because current flow through only one cell of a product term is really needed for sense amplifier operation.

It is therefore an object of the present invention to provide means for isolating the product term sense amplifiers of a PLD from row switching noise.

A further object is to provide an improved PLD with limited sense currents and very high input-to-output signal speeds.

SUMMARY OF THE INVENTION

A PLD is provided which is adapted to isolate the Miller capacitances of erased cells from the product terms, substantially reducing the product term switching noise, and to limit the cell current drawn through the sense amplifiers. In accordance with the invention, the sense transistors for each cell are disposed between the sense amplifier and select transistor, thereby isolating the overlap or Miller capacitance when the cell is in the erased state. Typically only a few of the sense transistors are programmed to the conductive state and most are erased (nonconductive). In this configuration, many rows or input lines may toggle without coupling switching noise onto the product term. Separate product term ground lines are employed for each product term. A current limiter is associated with each product term, and is adapted to limit the current flow through each product term to a predetermined maximum level, typically about the maximum current level which may be passed through one conductive memory cell.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 7 is a simplified equivalent circuit of the conductive memory cells, the sense amplifier and current limiter for an exemplary product term.

FIG. 8 is a current-voltage plot illustrating the biasing of an exemplary current limiting element in accordance with the invention.

DETAILED DESCRIPTION OF THE PREFERRED EMBODIMENT

The present invention comprises a novel programmable logic device with limited sense currents and switching noise isolation. The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications. Thus, the present invention is not intended to be limited to the embodiment shown, but is to be accorded the widest scope consistent with the principles and novel features disclosed herein.

Figure 2:
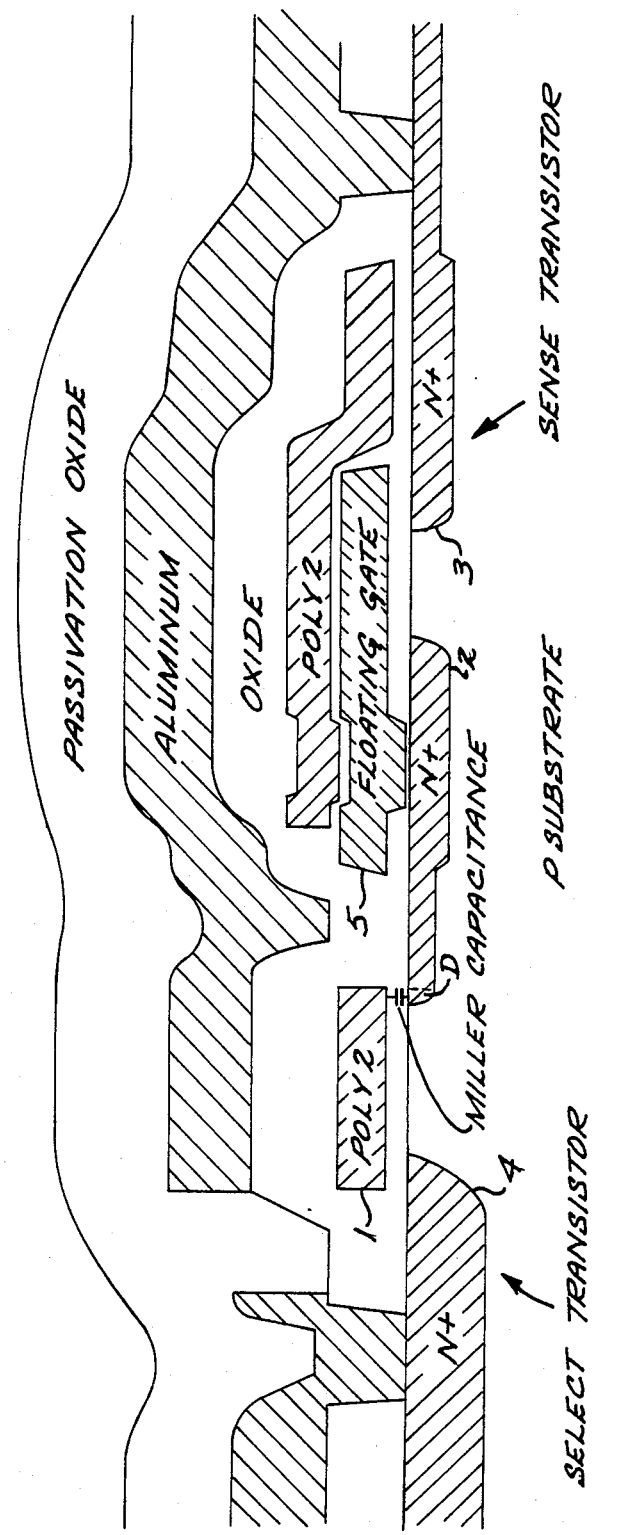
FIG. 2 is a cross-sectional view of a portion of a PLD memory cell, illustrating the overlap region comprising Miller capacitance of the cell select transistor.

FIG. 2 is a cross-sectional view of the memory cell employed in the PLD. The cell comprises a select transistor and a floating gate transistor as the sense or memory transistor. The floating gate device is adapted to employ the Fowler-Nordheim tunneling effect to remove or augment charge stored on the floating gate to place the sense transistor in either the enhancement or depletion mode. To allow Fowler-Nordheim tunneling to take place, the floating gate region 5 is separated from the drain region, N+region 2, by a very thin (100 Angstrom) layer of oxide.

The select transistor is formed by a polysilicon region 1, separated from the N+regions 2,4 by an oxide layer. The polysilicon region 1 comprises the gate electrode of the select transistor, with the source and drain comprising the N+regions 2,4 formed by N-type dopant implanted in the active area. During processing of the PLD, the N-type dopant laterally diffuses beneath the polysilicon gate region, forming an overlap region D. The overlap region creates a Miller capacitance between the gate and drain of the select transistor. The charge storing capacity of the Miller capacitance leads to switching noise as the select transistor is turned on and off.

Figure 1:
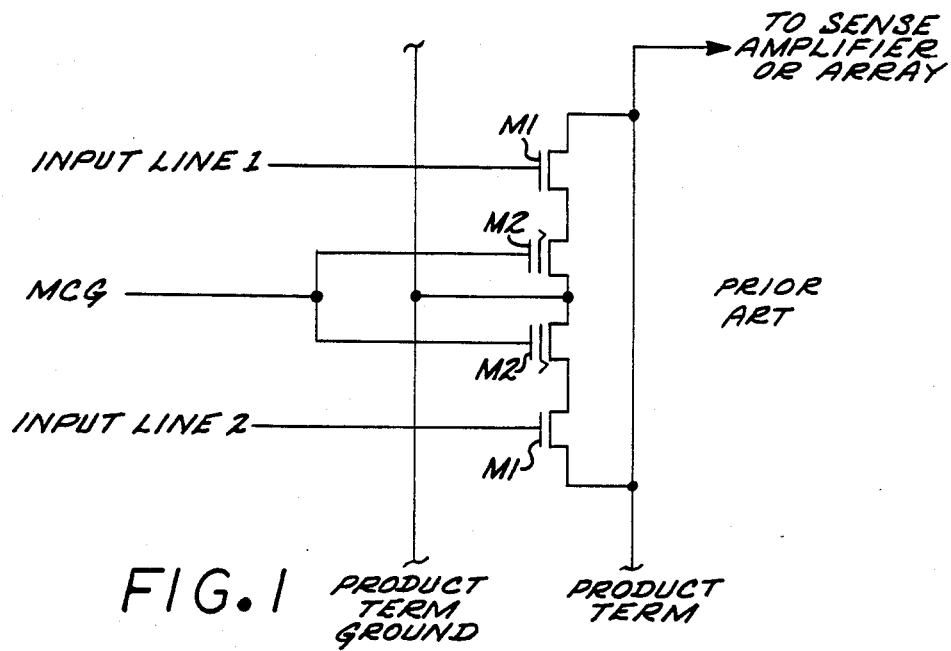
FIG. 1 is a simplified schematic drawing of two representative memory cells and input lines in a conventional electrically erasable memory array.
Figure 3:
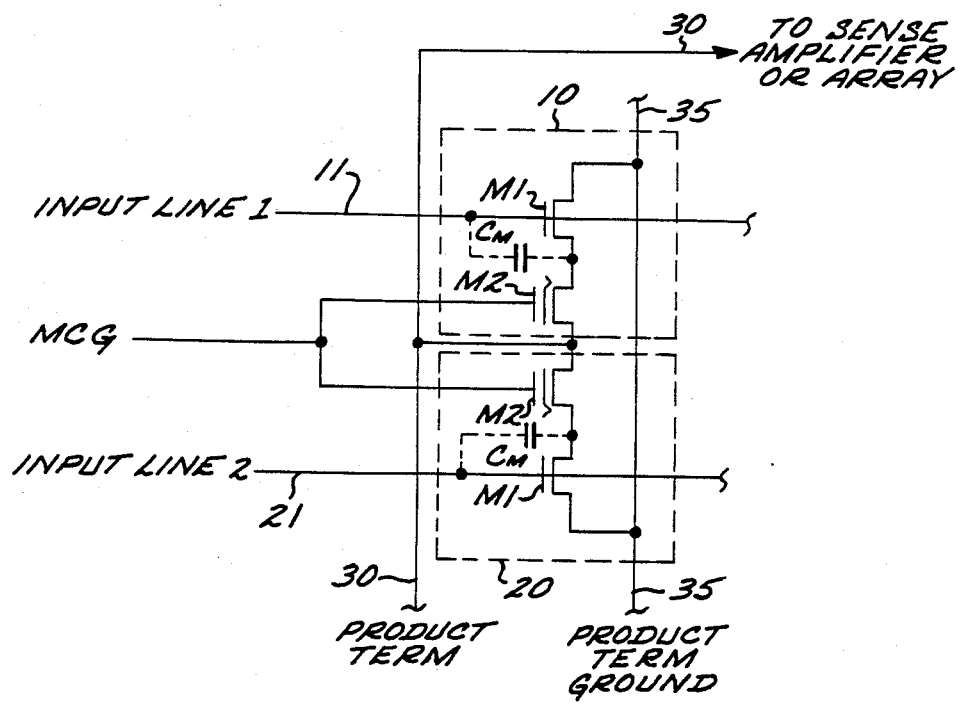
FIG. 3 is a simplified schematic drawing illustrating a PLD memory cell configuration in accordance with the invention.

The invention comprises means for limiting the noise which is coupled onto the product terms resulting from toggling of the input lines. FIG. 3 illustrates two cells 10,20 of a PLD array embodying this aspect of the invention. In contrast to the conventional electrically erasable memory configuration (illustrated in FIG. 1), the sense transistors M2 comprising each cell shown in FIG. 3 are disposed between the respective cell select transistors M1 and the product term 30. Input lines 11,21 drive each of the select transistor gates for each cell in rows 1 and 2. A typical AND array may have 32 input (row) lines and 64 product terms (columns). Each of input lines 11,21 for rows 1 and 2 drive the select gates of each of the 64 cells arranged in the respective row. As the status of the input is toggled during normal circuit operation, the select transistors will switch on and off. The respective Miller capacitances $C_m$ charge and discharge with the switching.

The sense transistors are disposed between the select transistors and the respective product term line 30. When the sense transistor is erased, i.e., in the nonconductive state, the select transistor is isolated from the product term line, the isolation of the erased sense transistor prevents switching noise from being coupled onto the product term line. If the sense transistor is conductive, there is no switching noise isolation for that particular cell. Yet, because more sense transistors are typically erased than are programmed to the conductive state, substantial isolation from noise coupling isolation is provided by the novel configuration illustrated in FIG. 3.

In order to implement this configuration, in the preferred embodiment, separate cell interrogation (read) and programming (write) lines are employed, since the select transistor now resides on the ground side of the matrix cell. The ground line now becomes the write path, requiring that each product term have a separate ground connection (product term ground 35). During programming, the ground connection is removed, and the programming data is placed on the individual product term ground lines and at the MCG node, connected to the gates of the sense transistors. Thus, if a selected cell is to be programmed to the enhancement mode, a high programming voltage (typically +20 volts) is applied to the MCG node, and the product term ground line is pulled to ground. Conversely, if the cell is to be programmed to the depletion mode, the MCG node is grounded, and the product term ground line is pulled up to the high programming voltage level. The select gate of the desired row in the product term is brought high, allowing data to be programmed into the cell. In the normal mode of operation, the programming circuits are isolated from the product term ground, and a connection is made to ground.

Figure 4:
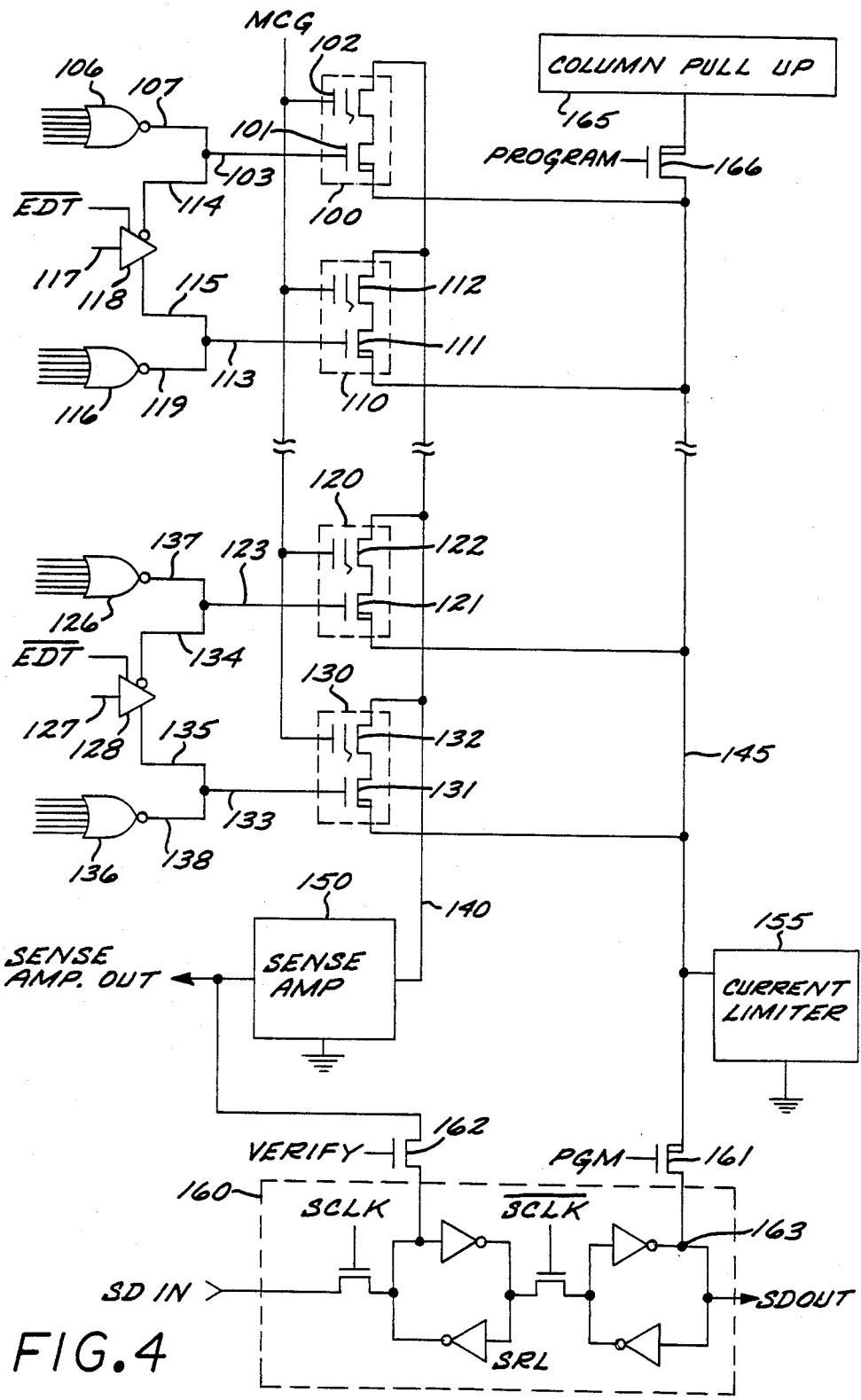
FIG. 4 is a simplified schematic diagram of a product term of a PLD, illustrating the memory cells, sense amplifier and current limiter in accordance with the invention.

FIG. 4 illustrates four cells 100,110,120,130 of a product term 140 in a PLD array employing the invention. As described above, each product term 140 or column is provided with a separate product term ground line 145. The sense transistors 102,112,122,132 of the four cells are distributed between the respective select transistors 101,111,121, 131 and the product term 140. The input of sense amplifier 150 is connected to the product term 140. Current limiter 155 connects the product term ground line 155 to ground.

Input line 117 is connected to input driver 118, which produces a true signal 115 and compliment signal 114. True signal 115 drives the gate 113 of select transistor 111 (cell 110). Compliment signal 114 drives the gate 103 of select transistor 101 (cell 100). In a similar fashion, input line 127 is coupled to input driver 128, which produces a true signal 135 and compliment signal 134. True signal 135 drives the gate 133 of select transistor 131 (cell 130). Compliment signal 134 drives the gate 123 of select transistor 121 (cell 120).

The elements shown in FIG. 4 are replicated to form an exemplary AND array of 2048 cells, arranged in 32 rows and 64 product terms. Each product term has associated with its product term a sense amplifier and with its product term ground a current limiter element.

Programming data is presented to the array by a shift register latch (SRL) comprising a plurality of stages; a representative stage 160 is shown in FIG. 4. In the preferred embodiment, the SRL comprises one stage per product term. Thus, the programming data is clocked into the SRL stages, and for the product term 140 shown in FIG. 4, is present at node 163.

During a device "edit" mode, the $\overline{EDT}$ signal goes low, disabling the row drivers 118,128 and enabling the row decoders 106,116,126,136. The inputs to the row decoders comprise a six-bit word selecting one of the 32 rows, turning on the 64 select transistors in that row. To bulk erase, the MCG node is raised to +20 volts, and the data node 163 is low. Transistor 161 is turned on with a high "PGM" signal. For all cells, the gate of the sense transistor will be at +20 volts and its drain will be grounded, causing electrons to tunnel to the floating gate from the drain, programming the transistor to the enhancement mode, with a threshold gate turn-on voltage of 6–8 volts (the "erased" state). The transistor will not conduct when an interrogation voltage, nominally +2.5 volts, is applied to its gate via the MCG node.

To program a selected cell, the gate of the select transistor is pulled to +20 volts by the row decoder, the MCG node is grounded, and the data at node 163 is high. With both transistors 161,166 turned on with respective high "PGM" (+5 volts) and "PROGRAM" (+20 volts) signals, the pull-up circuit 165 pulls up line 145 to +20 volts minus $V_T$, the turn-on threshold voltage of transistor 166. With its control gate grounded and its drain at +20 volts minus $V_T$, electrons will tunnel to the drain from the floating gate, programming the sense transistor to the depletion mode. In the normal user and verify modes, with the nominal 2.5 volt gate interrogation level, the sense transistor will be conductive.

When the PLD is in the normal user mode, $\overline{EDT}$ is high, disabling the row decoders 106,116,126,136 and enabling row driver 118,128. In this mode, "PGM" and "PROGRAM" are low, so that transistors 161,166 are nonconductive, and the current limiter 155 is enabled, providing a path to ground for line 145. The sense amplifier 150 is adapted to sense the state of the product term line 140.

Sense amplifier 150 provides a two-state output signal, in dependence on the status of the memory cells in the respective product line. From FIG. 4, it is apparent that each of the sense transistors 102,112,122,132 are coupled in parallel (through the respective select transistors 101,111, 121,131) between the product term 140 and the product term ground 145. If all sense transistors are erased, i.e., nonconductive when interrogated by an interrogation voltage on line MCG driving the gates of the sense transistors, then no current will flow between the product term 140 and its ground line 145. If one or more of the selected sense transistors is programmed to the conductive state, then one or more current paths is provided between the product term 140 and ground line 145.

Figure 5:
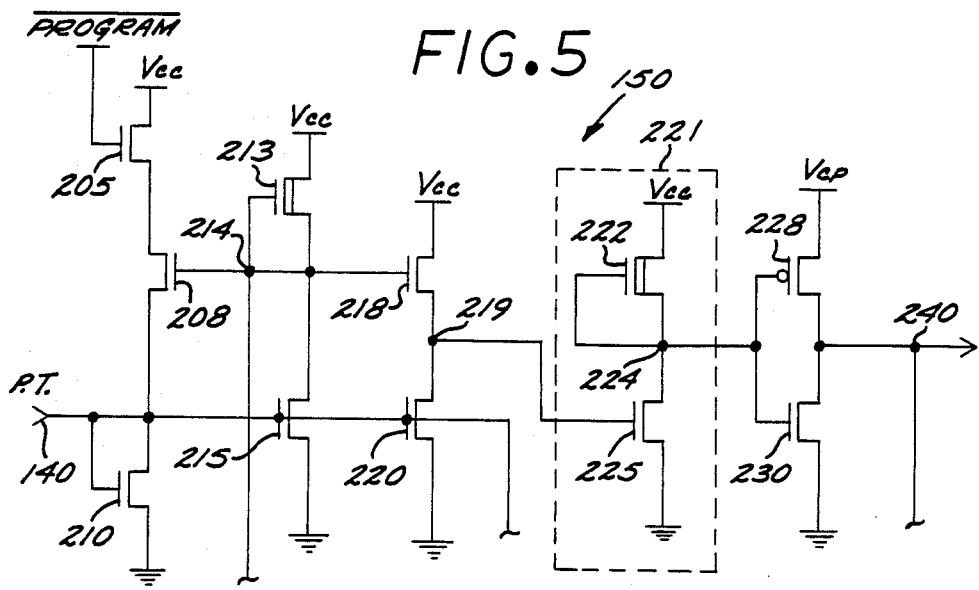
FIG. 5 is a schematic drawing of a sense amplifier employed in the preferred embodiment.

In order to provide a complete understanding of the invention, a schematic drawing of an illustrative sense amplifier 150 employed in the preferred embodiment is shown in FIG. 5. The amplifier 150 comprises a single-ended current sensing amplifier. The product term line 140 is connected to the input of the amplifier 150, whose front end comprises a bias circuit. Transistors 208,213 and 215 cooperate to set the product term bias on line 140 at about 1 volt (equivalent to one transistor threshold voltage drop $V_T$). With transistor 213 and 215 conductive, the potential at node 214 (connected to the gates of transistors 208,213, 218) is about $2V_T$. With the $V_T$ voltage drop across the gate and source of transistor 208, the voltage at line 140 is $2V_T - V_T$, or $V_T$.

The sense currents may be as low as 5 microamps, with an input voltage swing on the product term in the 25 millivolt range.

Transistor 210 acts as a load or "leaker" to hold the product term potential down for more capacitive coupling immunity and stability.

Transistors 218,220 form a push-pull configuration that drives the inverter 221 comprising N-MOS transistor 222 and transistor 225. Node 219 will be at $1V_T \pm 400$ V depending on the state of the product line 140. Inverter stage 221 provides some amplification. The final stage is a CMOS inverter comprising transistors 228 and 230, which provides a full voltage swing on the amplifier output at node 240.

During the sensing of a programmed memory cell i.e., with a floating gate device programmed to the depletion mode so that it conducts with the nominal interrogation voltage, the product term potential is directly coupled through an active select transistor and conductive floating gate device to ground. Current will flow from the amplifier through the product term 140, a select transistor, a sense transistor, and the product term ground line to ground. This charge flow weakens the drive on transistors 215 and 220, allowing the depletion transistor 213 to increase the drive on transistor 218. The N-MOS inverter 221 pulls down, i.e., transistor 225 turns on, pulling node 224 down, amplifying the signal further. The following CMOS inverter provides further gain of sense amplifier output 240.

During the sensing of an erased memory (nonconductive) cell, the product term 140 is pulled high to its quiescent operating point, which increases the drive to transistors 215 and 220. With the gates of transistors 215 and 220 driven high, the gate of transistor 218 is pulled low by inverter 241. Transistor 220 pulls down the gate of transistor 225, turning it off. Under these conditions, transistor 222 pulls up the gates of transistors 230 and 228 turning on transistor 230 and turning off transistor 228. Thus, node 240, the sense amplifier output, is low.

Figure 6:
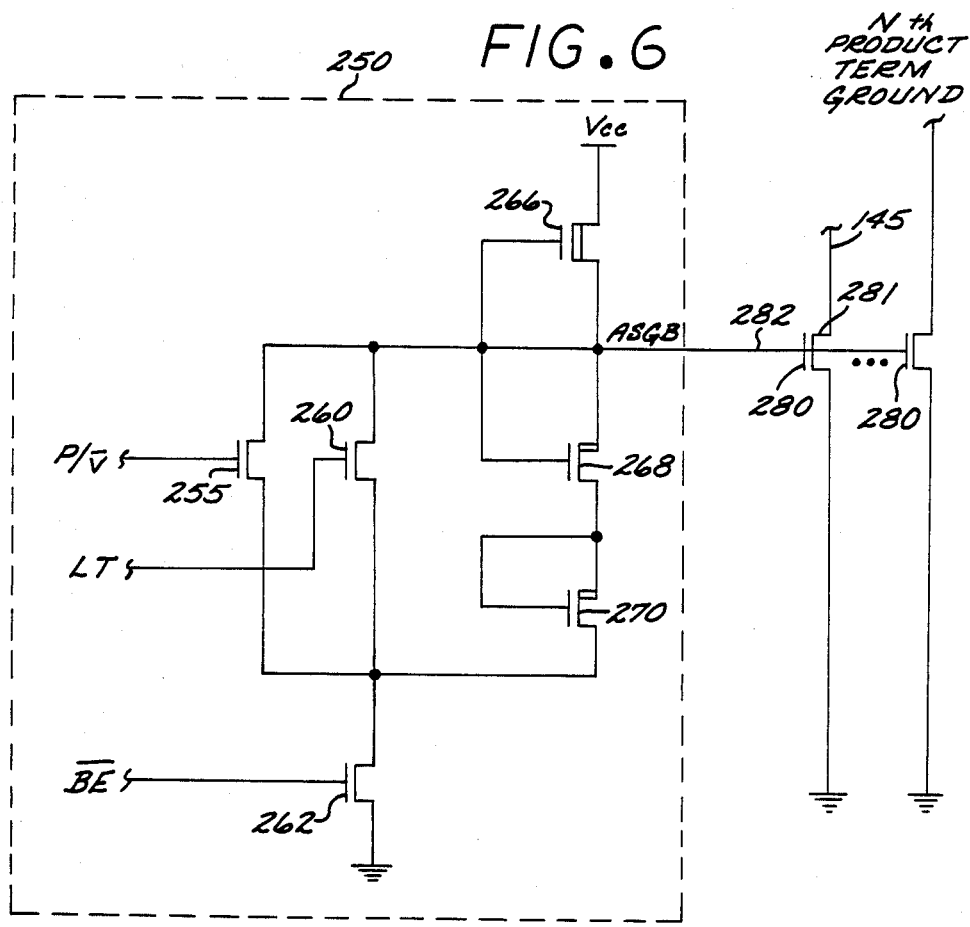
FIG. 6 is a schematic diagram of the current limiter and control logic circuit employed in the preferred embodiment.

It will be appreciated that, as the number of conductive cells in the product term increases, so will the cell current drawn through the sense amplifier 150. Another facet of the invention is the provision of current limiting means to limit the cell current drawn by the sense amplifier 150. A simplified schematic drawing of the of current limit circuitry is shown in FIG. 6. The current limiter comprises control logic circuitry 250 and a plurality of current limit elements 280, one for each product term ground in the array.

The control logic circuitry 250 is adapted to enable the current limit elements only during specific PLD operational modes. It is desired to provide current limiting operation during the PLD normal user mode, and to disable current limiting operation and decouple the product term ground line from ground while programming the memory cells, or during a logic test mode.

The respective current limited elements are controlled by the control logic output signal "ASGB" at node 282. To disable current limiter operation, node 282 is grounded, turning off transistor 280. This will occur when transistor 262 and either transistor 255 or 260 is conductive. The state of transistor 255 is controlled by the "P/V" signal, which is high during the programming cycle. Transistor 260 is controlled by the "LT" signal, which is high during the PLD logic test mode. Transistor 262 is controlled by the "$\overline{BE}$" signal, which is high except during the PLD bulk erase cycle. Thus, node 282 will be grounded during the programming cycle, or during the logic test mode.

The current limiter operates as a current mirror, controlled by the current flowing through transistor 266, biasing the gates of the respective N-channel pull-down transistors 280 acting as the current limit elements. The preferred embodiment has been designed to limit the cell current of 16 programmed cells to about 120 microamps per product term.

In operation, when the current limiter is active, node 282 is biased just above twice the transistor threshold turn on voltage $V_T$, or about 2 volts. Threshold voltage drops of $V_T$ occur from the gate to the source of each of transistors 268 and 270, resulting in the $2V_T$ bias level at node 282.

The drain 281 of the current limit transistor 280 is connected to the product term ground line 145. With its gate at $2V_T$, the transistor 280 will be biased to the conductive state, allowing current to flow through the transistor.

A simplified equivalent circuit of the product term, the conductive cells on the product term and the current limiter is shown in FIG. 7. The memory cells of FIG. 4 are shown in FIG. 7 as effective resistances, whose impedances will depend on the respective cell state. Thus, cells 100, 110, 120 and 130 form a parallel network coupling the product term 140 to product term ground 145. Sense amplifier 150 is coupled to the product term 140. The current limiter element 280 (FIG. 7) connects the product term ground line 145 to ground.

As described above, the amplifier 150 comprises a voltage source which will source current through conductive memory cells. The impedance of a conductive cell is nominally low, while the impedance of a nonconductive cell is nominally quite high. Depending on variables such as process tolerances and the like, the actual cell impedances may be higher or lower than predicted. Thus, the effective impedance from the sense amplifier to ground through the cells current limiter element is variable, since the number of cells (and their individual impedances) which are conductive at any given time is variable. As the effective impedance between the product term 140 and product term ground 145 changes, so does the cell current drawn through the sense amplifier, since the sense amplifier is configured as a voltage source. As the impedance goes down and the current flow increases, the drain 281 of the transistor 280 biases upwardly to a threshold level, at which point the sense amplifier will stop delivering more current.

The current limiting operation of the transistor follows from the following relationship describing the current flow through an MOS device:

$$I_{DS} = \mu\, C_{OX}\frac{W}{L} (V_{GS} - V_T - V_D/2)\, V_D, \quad (1)$$

for

-continued $$V_{GS} - V_T \leq V_D$$

where
  $I_{DS}$=drain to source current
  $\mu$=carrier mobility
  $C_{OX}$=capacitance per unit area of gate oxide
  W=geometric width of the transistor
  L=length of transistor channel
  $V_{GS}$=voltage from gate to source
  $V_T$=turn-on threshold voltage for transistor
  $V_D$=drain to source voltage Of these parameters, $V_T$, $\mu$, $C_{OX}$, W and L are physical parameter constants for a given die and process. The only variables in the current equation are $I_{DS}$, $V_{GS}$, and $V_D$. However, in the disclosed embodiment, circuit 250 biases $V_{GS}$, i.e., the voltage at node 282, to a predetermined, fixed level (approximately $2V_T$). Hence, in order to increase the current $I_{DS}$, $V_D$ must also increase. When $V_D$ rises to $V_T$, the sense amplifier bias level, the sense amplifer may raise $V_D$ no further, effectively limiting the maximum current $I_{DS}$ through transistor 280.

FIG. 8 is a simplified graph illustrating the relationship between $I_{DS}$, $V_D$, and $V_{GS}$ for typical transistor operation. Thus, the magnitude of the current $I_{DS}$ is a function of the drain voltage $V_D$ and gate-source voltage $V_{GS}$. Although two exemplary values of $V_{GS}$ are illustrated, the current limiter logic circuit biases $V_{GS}$ at $2V_T$. The voltage $V_D$ on the transistor drain will vary as the effective impedance between the product term and product term ground line changes, but is limited to the sense amplifier input bias level, i.e., $V_T \pm 25$ mV. This in turn limits the current $I_{DS}$ to a maximum level, $I_M$.

The control logic 250 is adapted to turn off the current limit transistors during programming of the memory cells of the array, and during logic testing. This allows the memory cell nodes to float with respect to the current limit elements.

With the current limiter in operation, the maximum current flow through the current limiter elements is about the maximum current which may be passed through one programmed cell. For an array with 32 programmable cells, driven by true and compliment signals of 16 inputs lines, in parallel with a series device (the current limiter), at any given time 16 cells will be selected. Without the current limiter, the maximum cell current through the sense amplifier for one product term may possibly amount to about 0.8 mA. With the current limiter of the present invention, only about 50 to 100 microamperes flows for each product term, a very substantial reduction.

There has been described a novel circuit for limiting noise coupling and product term current in a PLD. It is understood that the above-described embodiment is merely illustrative of the many possible specific embodiments which can represent principles of the present invention. Numerous and varied other arrangements can readily be devised in accordance with these principles by those skilled in the art without departing from the spirit and scope of the invention.

What is claimed is:
1. An integrated programmable logic device for providing logical output signals in response to a plurality of logical input signals, comprising:
  a plurality of array lines for connection to a plurality of logical input signals, more than one of which array lines may be active at any given time during operation of the device;

a plurality of product terms;

an array of programmable memory cells arranged in rows and columns, each cell having conductive and nonconductive states and associated with respective ones of said array lines and said product terms for selectively connecting respective array lines to corresponding product terms in dependence on said cell state and the logical state of the logical array signal applied to the corresponding array line;

a plurality of high speed current-sensing, substantially constant voltage sense amplifiers for biasing the potential of the respective product terms to a predetermined level and for sensing the logical state of said respective product terms in accordance with the states of selected ones of the memory cells associated with the respective product term lines; and current limiter means for limiting the cell current which may be drawn through said respective product term lines to a predetermined maximum level to limit the maximum device power consumption.

2. The programmable logic device of claim 1 wherein said sense amplifiers respectively comprise means responsive to the level of current drawn through said product term for providing a logical sense amplifier output state.

3. The programmable logic device of claim 1 wherein said current limiting means comprises a control logic circuit and a plurality of current limiter elements, each controlled by said logic circuit, one for each of said product term lines.

4. The programmable logic device of claim 3 further comprising a plurality of product term ground lines, one for each of said product terms, and wherein said memory cells associated with a respective one of said product terms are connected in parallel connection between said product term and said respective product term ground, and wherein said respective current limiter elements selectively connect an associated product term ground line to ground.

5. The programmable logic device of claim 4 wherein said control logic circuit is adapted to selectively control said current limiter elements to selectively disconnect said product term ground lines from ground during a device programming mode wherein the states of the memory cells are programmed.

6. The integrated programmable logic device of claim 4 wherein said current limiter elements each comprise a transistor means having its drain connected to said corresponding product term ground line, its source connected to ground, and its gate driven by said control logic circuit.

7. The integrated programmable logic device of claim 6 wherein said control logic circuit is adapted to bias the gates of said transistor means to a first voltage level, thereby limiting the maximum current flow through the transistor.

8. An integrated programmable logic device, comprising:

a plurality of input lines;

a plurality of product term lines; an array of memory cells, each associated with predetermined ones of said input lines and arranged to selectively connect said input line to said product term in dependence on the cell state when the cell is interrogated by an interrogation signal on said corresponding input line, each cell comprising an MOS transistor memory element and a cell selection element;

a plurality of sensing means, one each associated with a respective one of said product terms and adapted to sense the state of interrogated ones of the memory cells associated with said product term;

current limiting means for limiting the amount of cell current drawn through each of the product term lines to approximately the maximum current which may be drawn through one conductive memory cell; and wherein said selection element and said memory element of each cell are arranged in a seriesconnected relationship with said memory element disposed between said selection element and the corresponding product term to isolate said selection element and corresponding selection element switching noise from said product term when said memory element is in the nonconductive state.

9. An integrated programmable logic device for providing logical output signals in response to a plurality of logical input signals, comprising:

a plurality of array lines for connection to respective logical input signals, and wherein more than one of said array lines may be active at any given time during operation of the device;

a plurality of product term lines; a plurality of product term ground lines for connection to ground during the operation of the programmable logic device, one each corresponding to one of said product term lines;

a matrix of memory cells arranged in rows and columns, each cell comprising a reprogrammable MOS transistor memory element and a cell selection element arranged in series-connected relation between said respective product term line and product term ground line, said memory element being disposed between said cell selection element and said product term line, and the memory cells associated with a product term line being arranged in a column in parallel connection between said corresponding product term line and said product term ground line, each cell for selectively connecting a predetermined array line to a predetermined product term line in dependence on the state of the logical input signal applied to said array line and the state of said memory element; and a plurality of high-speed current-sensing substantially constant voltage sense amplifiers, one each coupled to a respective one of said product term lines for biasing the potential of the respective product terms to a predetermined level and for sensing the logical state thereof in accordance with the state of selected ones of the memory cells associated with said product term line.

10. The programmable logic device of claim 9 further comprising current limiting means for limiting the respective product term currents to a predetermined maximum level to limit the maximum device power consumption.

11. The programmable logic device of claim 9 wherein:

said sense amplifiers are each responsive to the current level drawn through a predetermined product term line; and further comprising a plurality of current limiting circuits connecting said respective product therm ground lines to ground during the operation of the programmable logic device for limiting the maximum current drawn through said product term line to a predetermined maximum level.

12. The programmable logic device of claim 9 wherein said cell selection element comprises a first transistor whose gate is driven by said respective array line, said memory element comprises an electrically erasable floating gate transistor, and wherein the drain of said first transistor is connected to the source of said floating gate transistor, and the drain of said floating gate transistor is connected to said respective product term.

13. The programmable logic device of claim 12 wherein the source of said respective first transistors are connected to corresponding product term ground lines.

14. An integrated programmable logic device for providing logical output signals in response to a plurality of logical input signals, comprising:
   a plurality of array lines for connection to a plurality of logical input signals, and wherein more than one of which array lines may be active at any given time during operation of the device;
   a plurality of product term lines;
   a plurality of product term ground lines connected to ground during operation of the device, one each corresponding to a respective one of said product term lines;
   an array of electrically erasable and programmable memory cells having conductive and nonconductive states, said cells arranged in rows and columns, each cell connected between a predetermined product term line and its corresponding product term ground line and each cell associated with a respective one of said array lines for selectively connecting a respective array line to a predetermined product term in dependence on said cell state and the logical state of the logical array signal applied to the corresponding input line;
   a plurality of high speed current-sensing, substantially constant voltage sense amplifiers for sensing the logical state of said respective product term lines in accordance with the states of selected ones of the memory cells associated with the respective product term lines, said respective sense amplifiers each comprising means for biasing the potential of the respective associated product term to a predetermined product term potential, and means responsive to the level of current drawn through said product term for providing a logical sense amplifier output signal; and
   current limiting means for limiting the amount of current drawn through said respective product term lines to a predetermined maximum level to limit the device power consumption.

15. The programmable logic device of claim 14 wherein said current limiting means comprises a control circuit and a plurality of current limiter elements connecting said product term ground lines to ground during the operation of said device, each element controlled by said control circuit.

16. The programmable logic device of claim 15 wherein said control circuit further comprises means for disabling said current limiter elements to disconnect said product term ground lines from ground during a programming device mode for programming the states of the respective memory cells.

17. The programmable logic device of claim 15 wherein said current limiter elements each comprise a transistor having its drain connected to said corresponding product term ground line, its source connected to ground, and its gate connected to said control circuit, said control circuit comprises means for selectively biasing said gates to a first gate potential during device operation whereby the maximum current drawn through said transistor during device operation is dependent on the potential difference between said first gate potential and said product term potential.

18. The programmable logic device of claim 17 wherein said control circuit further comprises means for biasing said respective transistor gates to a second gate potential during a device programming mode wherein the states of said memory cells are programmed, said second gate potential selected to drive said transistor elements to the nonconductive state to effectively disconnect said product term ground lines from ground.

19. An integrated programmable logic device, comprising:
   a plurality of array lines;
   a plurality of product term lines;
   an array of memory cells arranged in rows and columns, each associated with predetermined respective ones of said array lines and said product term lines and comprising a programmable memory element having two possible states, a conductive state and a nonconductive state, and a cell selection element controlled by the state of the logical input signal applied to the corresponding array line, each of said cells arranged to selectively connect said input logical signal on said corresponding array line to said corresponding product term in dependence on the state of said input logical state and said cell state;
   a plurality of sensing means, one each coupled to a respective one of said product terms for sensing the logical state thereof in accordance with the sates of the selected ones of the memory cells associated with said product;
   current limiting means for limiting the amount of cell current drawn through the sensing means during operation of the programmable logic device to a predetermined maximum current level; and
   wherein said selection element and said memory element of each cell are arranged with said memory element disposed between said selection element and the corresponding product term to isolate said selection element and corresponding selection element switching noise from said product term when said memory element is in the nonconductive state.

20. The invention of claim 19 further comprising a plurality of product term ground lines, one each corresponding to one of said product terms, and wherein the memory cells associated with a product term line are disposed in parallel relationship between said product term line and said product term ground line, and the current limit means comprises a plurality of current limit elements, one each disposed in series connection with a corresponding one of said product term ground lines and ground.

21. The programmable logic device of claim 20 wherein said current limit elements each comprise a transistor means having its source connected to ground during operation of the device, its drain connected to the corresponding product term ground line, and its gate connected to a control circuit.

22. The programmable logic device of claim 21 wherein said control circuit is adapted to bias the gates of said current limit elements at a first predetermined bias level.

23. An integrated programmable logic device comprising:
   a plurality of input lines;
   a plurality of product term lines;
   a plurality of product term ground lines;
   an array of memory cells, each associated with predetermined ones of said input lines, product term lines and product term grounds lines, and arranged to selectively connect said input line to said product term in dependence on the cell state, each cell being disposed in parallel relationship between said product term line and product term ground line and comprising a memory element capable of being programmed to the conductive state or electrically erased to the nonconductive state, and a cell selection element coupled to said input line, said memory cell further comprising means for isolating said cell selection elements from the corresponding product term line when said memory element is in the nonconductive state;
   a plurality of sensing means, one each associated with a respective one of said product term lines, for sensing the state of said product term line;
   current limiting means for limiting the amount of cell current drawn through the product term lines, said means comprising a plurality of current limit elements, one each disposed in series connection with a corresponding one of said product term ground lines and ground, said current limit elements each comprising a transistor having its source connected to ground during operation of the programmable logic device, its drain connected to the corresponding product term ground line and its gate connected to a control circuit comprising means for biasing the gates of said current limit transistors at a first predetermined bias level;
   wherein said sensing means comprises input level bias means for limiting the input potential at the sensing means to a second predetermined bias level, whereby the maximum current flow through said respective current limit transistor is limited to a predetermined maximum level in dependence on the potential difference between said predetermined bias level and said second predetermined bias level.

24. The programmable logic device of claim 23 wherein said control circuit is adapted to bias the gate of each said transistor comprising said current limit elements at about each transistor's turn-on voltage with respect to the source of a respective transistor.

25. An integrated programmable logic device, comprising:
   a plurality of array lines;
   a plurality of product term lines;
   an array of memory cells arranged in rows and columns, each associated with predetermined respective ones of said array lines and said product term lines and comprising a programmable MOS transistor memory element having two possible states, a conductive state and a nonconductive state, and a cell selection element controlled by the state of the logical input signal applied to the corresponding array line, each of said cells arranged to selectively connect said input logical signal on said corresponding array line to said corresponding product term in dependence on the state of said input logical state and said cell state;
   a plurality of high-speed current-sensing, substantially constant voltage sense amplifiers for biasing the potential of the respective product terms to a predetermined level and for sensing the logical state of said respective product terms in accordance with the states of selected ones of the memory cells associated with the respective product term lines; and
   wherein said selection element and said memory element of each cell are arranged with said memory element disposed between said selection element and the corresponding product term to isolate said selection element and corresponding selection element switching noise from said product term and said corresponding sense amplifier when said memory element is in the nonconductive state.

26. The programmable logic device of claim 25 wherein said selection element comprises a transistor element which switches between the conductive and nonconductive states in dependence on the state of the logical input signal applied to the corresponding array line.

* * * * *

UNITED STATES PATENT AND TRADEMARK OFFICE
CERTIFICATE OF CORRECTION

PATENT NO. : 4,833,646
DATED : May 23, 1989
INVENTOR(S) : John E. Turner

It is certified that error appears in the above-identified patent and that said Letters Patent is hereby corrected as shown below:

Cover page, OTHER PUBLICATIONS, line 8, delete "No.22,";

Column 6, line 22, change "±400 V" to --±400mV--;

Column 7, line 51, change "ceils" to --cells--;

Column 10, line 68, change "therm" to --term--;

Column 14, line 1, after "said" insert --first--.

Signed and Sealed this

Twenty-fifth Day of June, 1991

Attest:

HARRY F. MANBECK, JR.

Attesting Officer

Commissioner of Patents and Trademarks